(12) United States Patent
O'Meara et al.

(10) Patent No.: US 8,809,169 B2
(45) Date of Patent: Aug. 19, 2014

(54) MULTI-LAYER PATTERN FOR ALTERNATE ALD PROCESSES

(75) Inventors: David L. O'Meara, Poughkeepsie, NY (US); Aelan Mosden, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 95 days.

(21) Appl. No.: 13/250,937

(22) Filed: Sep. 30, 2011

(65) Prior Publication Data

US 2013/0084688 A1    Apr. 4, 2013

(51) Int. Cl.
*H01L 21/20* (2006.01)
*H01L 21/033* (2006.01)

(52) U.S. Cl.
CPC ........ *H01L 21/0337* (2013.01); *H01L 21/0338* (2013.01)
USPC ............................. 438/478; 438/702; 438/717

(58) Field of Classification Search
CPC .................................................. H01L 21/0337
USPC .......................................................... 438/478
See application file for complete search history.

(56) References Cited

U.S. PATENT DOCUMENTS

| 6,063,688 | A | 5/2000 | Doyle et al. |
| 7,718,529 | B2 | 5/2010 | Deng et al. |
| 2004/0175893 | A1 | 9/2004 | Vatus et al. |
| 2006/0113616 | A1 | 6/2006 | Liu et al. |
| 2008/0122125 | A1* | 5/2008 | Zhou .............................. 257/797 |
| 2009/0186485 | A1* | 7/2009 | Lam et al. ..................... 438/702 |
| 2009/0311634 | A1 | 12/2009 | Yue et al. |
| 2010/0112496 | A1 | 5/2010 | Nakajima et al. |
| 2010/0267238 | A1 | 10/2010 | Johnson et al. |
| 2011/0117743 | A1 | 5/2011 | Bai et al. |

OTHER PUBLICATIONS

International Search Report and Written Opinion issued for corresponding International Application PCT/US12/55299, dated Nov. 19, 2012, 17 pp.

* cited by examiner

*Primary Examiner* — Ajay K Arora
(74) *Attorney, Agent, or Firm* — Wood, Herron & Evans, LLP

(57) ABSTRACT

A method of patterning a substrate. A sacrificial film is formed over a substrate and a pattern created therein. A first spacer layer is conformally deposited over the patterned sacrificial film and at least one horizontal portion of the first spacer layer is removed while vertical portions of the first spacer layer remain. A second spacer layer is conformally deposited over the patterned sacrificial film and the remaining portions of the first spacer layer. At least one horizontal portion of the second spacer layer is removed while vertical portions of the second spacer layer remain. Conformal deposition of the first and second spacer layers is optionally repeated one or more times. Conformal deposition of the first layer is optionally repeated. Then, one of the first or second spacer layers is removed while substantially leaving the vertical portions of the remaining one of the first or second spacer layers.

19 Claims, 15 Drawing Sheets

MULTI-LAYER PATTERN FOR ALTERNATE ALD PROCESSES

FIELD OF THE INVENTION

This invention relates to a method of patterning a thin film on a substrate, and more particularly to a method of using a sacrificial film and conformal deposition to pattern a thin film on a substrate.

BACKGROUND OF THE INVENTION

In material processing methodologies, pattern etching comprises the application of a thin layer of a light-sensitive material, such as a photo-resist, to an upper surface of a substrate that is subsequently patterned in order to provide a mask for transferring this pattern to the underlying thin film during etching. The patterning of the light-sensitive material generally includes exposing the light-sensitive material to a radiation source through a reticle (and associated optics) using, for example, a photo-lithography sensitive system, and removing the irradiated regions of the light-sensitive material (as in the case of a positive photo-resist) or non-irradiated regions (as in the case of negative photo-resist) using a developing solvent. Moreover, this mask layer may comprise multiple sub-layers. Photo-lithographic methods are limited dimensionally by the wavelengths of light or electromagnetic radiation used to react with the photo-resist, and the corresponding optics required to manage the wavelengths of light.

More recently, double patterning technologies have been used to meet the increasing need to produce smaller features. There are two dominant methods for double patterning: (1) sidewall or spacer processes and (2) double lithography processes. In the spacer process, the spacer is used as the final mask to create the final pattern in the thin film. The spacer is generated in a multi-layer mask, wherein the mask layer may comprise a light-sensitive material, such as the photo-resist described above.

However, conventional methods have not yielded the desired high-profile features. There is thus a need for new methods for forming ultra-thin raised features on substrates and/or ultra-thin features formed in substrates.

SUMMARY OF THE INVENTION

The present invention provides methods for forming ultra-thin raised features on substrates and/or ultra-thin features formed in substrates. The methods provide a definition of features that is smaller than conventional photolithographic techniques for a hard mask feature as well as the spacing between the features, since both dimensions are defined by the thickness of the respective spacers. In that regard, and in accordance with one embodiment of the present invention, a method of patterning a substrate includes forming a sacrificial film over a substrate and creating a pattern therein. A first spacer layer is conformally deposited over the patterned sacrificial film and then at least one horizontal portion of the first spacer layer is removed while leaving the vertical portions of the first spacer layer. A second spacer layer is conformally deposited over the patterned sacrificial film and the remaining portions of the first spacer layer. At least one horizontal portion of the second spacer layer is then removed while leaving the vertical portions of the second spacer layer. The conformal deposition of the first and second spacer layers is optionally repeated one or more times. The conformal deposition of the first spacer layer is optionally repeated. Then, one of the first spacer layer or the second spacer layer is removed while substantially leaving vertical portions of the remaining one of the first and second spacer layers.

According to another embodiment of the present invention, a method of patterning a substrate includes forming a sacrificial film over a substrate and creating a pattern therein. A first spacer layer is conformally deposited over the patterned sacrificial film and then at least one horizontal portion of the first spacer layer is removed while leaving the vertical portions of the first spacer layer. Those portions of the sacrificial film not overlaid by the removed portions of the first spacer layer are removed. A second spacer layer is conformally deposited over the patterned sacrificial film and the remaining portions of the first spacer layer. At least one horizontal portion of the second spacer layer is removed while leaving the vertical portions of the second spacer layer. A third spacer layer is conformally deposited over the patterned sacrificial film and the remaining portions of the first and second spacer layers. At least one horizontal portion of the third spacer layer is then removed while leaving the vertical portions of the third spacer layer. The conformal deposition of the second and third spacer layers is optionally repeated one or more times. The conformal deposition of the second spacer layer is optionally repeated. Then the first and third spacer layers that are not overlaid by the second spacer layer are removed.

Still another embodiment of the present invention is directed to a method of patterning a substrate includes forming a sacrificial film over a substrate and creating a pattern therein. A first spacer layer is conformally deposited over the patterned sacrificial film and then at least one horizontal portion of the first spacer layer is removed while leaving the vertical portions of the first spacer layer. A second spacer layer is conformally deposited over the patterned sacrificial film and the remaining portions of the first spacer layer. At least one horizontal portion of the second spacer layer is then removed while leaving the vertical portions of the second spacer layer. The conformal deposition of the first and second spacer layers is optionally repeated one or more times. The conformal deposition of the first spacer layer is optionally repeated. The sacrificial film is removed and one of the first spacer layer or the second spacer layer is also removed. An epitaxial layer is selectively formed over the substrate and then the remaining one of the first and second spacer layers is removed to form at least one feature in the epitaxial layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
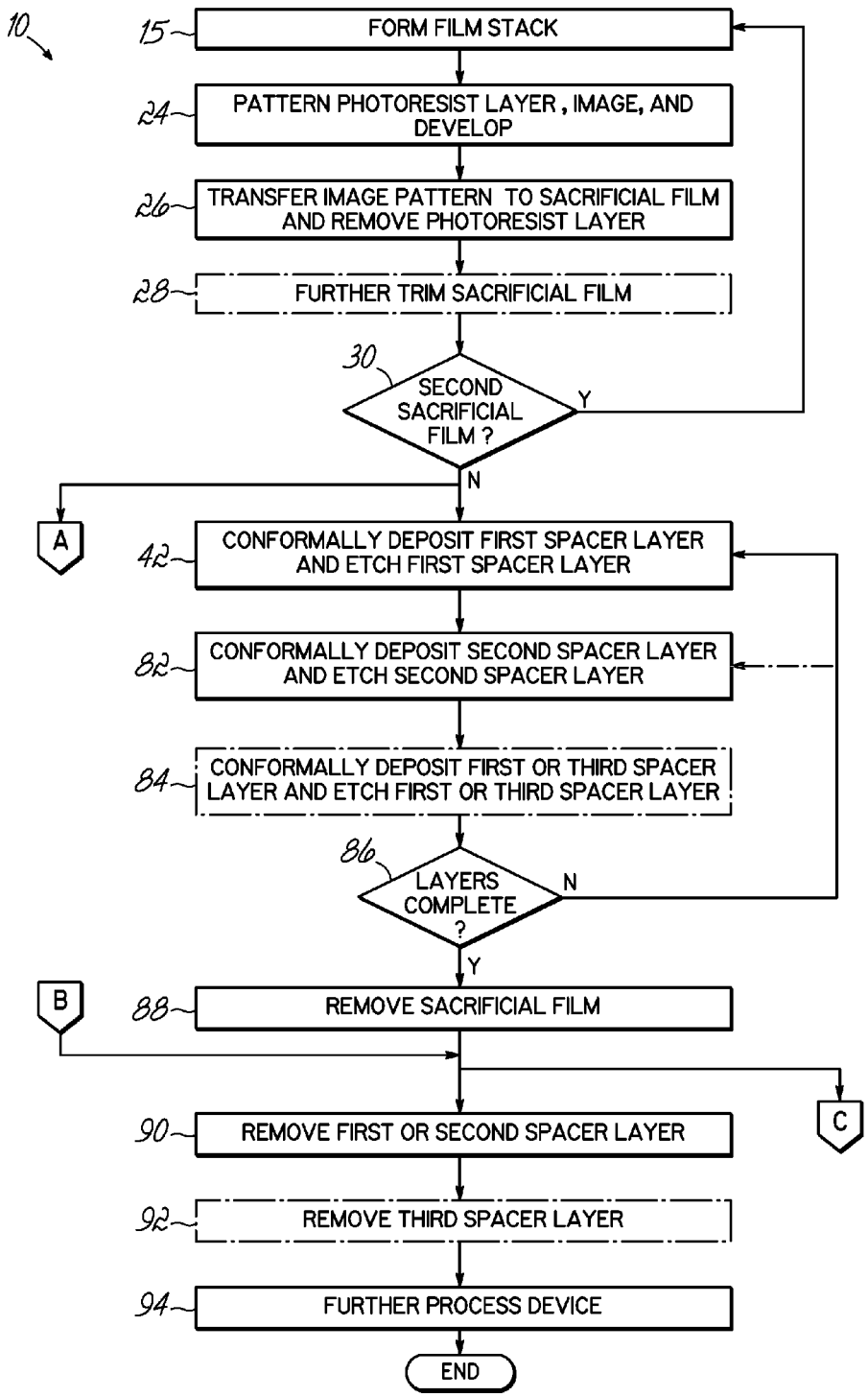
FIG. 1 is a flow chart illustrating an exemplary method of patterning a thin film on a substrate in accordance with one embodiment of the present invention.
Figure 2A:
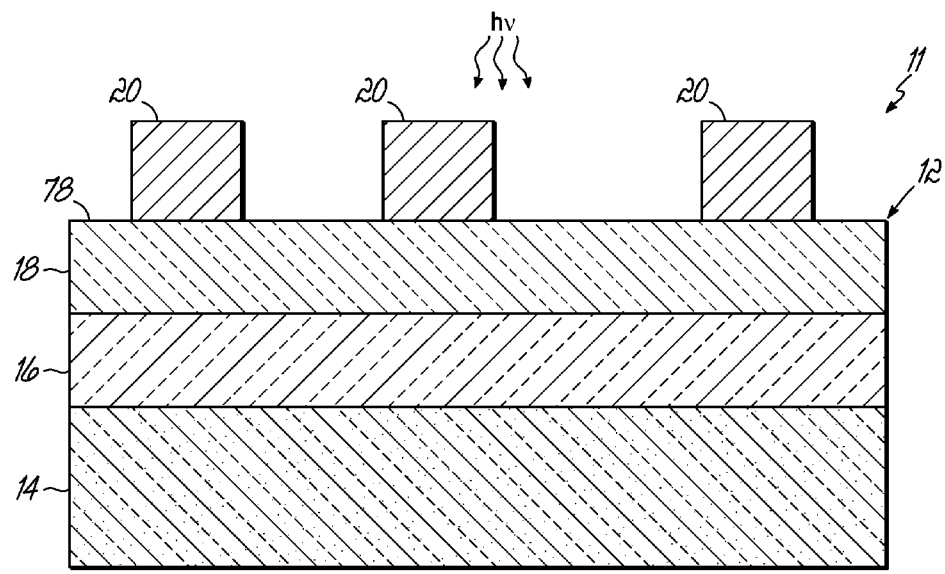
FIGS. 2A-2K illustrate, schematically, a method of patterning a thin film on a substrate in accordance with the method of FIG. 1.

Turning now to the figures, and in particular to FIGS. 1 and 2A, a method 10 of patterning a structure in a thin film formed on a substrate for manufacturing a device 11 is described. That is, in 15, a lithographic structure comprising a film stack 12 is formed on a substrate 14. The film stack 12 includes a thin film 16 formed on the substrate 14, a sacrificial film 18 formed on the thin film 16, and a photo-resist layer 20 formed on the sacrificial film 18.

The thin film 16 may comprise a conductive layer, a non-conductive layer, or a semi-conductive layer. For instance, the thin film 16 may include at least one material layer comprising a silicon-containing material, such as poly-silicon, silicon dioxide, silicon nitride, silicon carbide, or silicon oxynitride, etc. The thin film 16 may comprise a low dielectric constant (i.e., low-k) or ultra-low dielectric constant (i.e., ultra-low-k) dielectric layer having a nominal dielectric constant value that is less than the dielectric constant of $SiO_2$, which is approximately 4 (e.g., the dielectric constant for thermal silicon dioxide ranges from about 3.8 to about 3.9). More specifically, the thin film 16 may have a dielectric constant ranging from about 1.6 to about 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organosiloxane), deposited using a chemical vapor deposition ("CVD") technique. Examples of such films include BLACK DIAMOND CVD organosilicate glass ("OSG") films, which are commercially-available from Applied Materials, Inc. (Santa Clara, Calif.), or CORAL CVD films, which are commercially-available from Novellus Systems, Inc. (San Jose, Calif.). Alternatively, these dielectric layers may include porous inorganic-organic hybrid films comprised of a single-phase, such as a silicon oxide-based matrix having $CH_3$ bonds that hinder full densification of the film 16 during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane ("HSQ") or methyl silsesquioxane ("MSQ"), deposited using a spin-on dielectric ("SOD") technique. Examples of such films include FOX HSQ, which is commercially-available from Dow Corning (Midland, Mich.), XLK porous HSQ, which is also commercially-available from Dow Corning, and JSR LKD-5109, which is commercially-available from JSR Microelectronics (Sunnyvale, Calif.). Still alternatively, these dielectric layers may comprise an organic material deposited using an SOD technique. Examples of such films include SILK-I, SILK-J, SILK-H, SILK-D, and porous SILK semiconductor dielectric resins that are commercially-available from Dow Chemical, and GX-3, and GX-3P semiconductor dielectric resins commercially available from Honeywell (Morristown, N.J.).

The thin film 16 may be formed using a vapor deposition technique, such as CVD, plasma enhanced CVD ("PECVD"), atomic layer deposition ("ALD"), plasma enhanced ALD ("PEALD"), physical vapor deposition ("PVD"), or ionized PVD ("iPVD"), or a spin-on technique, such as those offered in the Clean Track ACT 8 SOD (spin-on dielectric), ACT 12 SOD, and Lithius coating systems commercially available from Tokyo Electron Limited ("TEL") (Minato-ku, Tokyo). The Clean Track ACT 8 (200 mm), ACT 12 (300 mm), and Lithius (300 mm) coating systems provide coat, bake, and cure tools for SOD materials. The track system may be configured for processing substrates of varying sizes, include substrates having diameters of 100 mm, 200 mm, 300 mm, and greater. Other systems and methods for forming a thin film on a substrate are well known to those skilled in the art of both spin-on technology and vapor deposition technology.

The sacrificial film 18, formed on the thin film 16, may comprise an anti-reflective coating ("ARC") layer, e.g., a bottom ARC ("BARC"), and may optionally include additional layers not specifically shown herein. ARC layers possess anti-reflective properties that are suitable for use as an anti-reflective coating and that withstand degradation during a photo-resist removal step. Resistance to degradation during removal of the photo-resist allows for selective removal of the photo-resist using standard plasma ashing processes while leaving the sacrificial structure intact.

In some embodiments, the sacrificial film 18 may comprise a silicon-containing ARC layer, which enables double patterning of thin films by providing adequate mechanical properties for withstanding patterning processes, conformal deposition over ARC layer structures, and subsequent removal process(es). The sacrificial film 18 may further optionally include a hard mask layer or a planarization layer, such as an organic planarization layer ("OPL") disposed between the thin film 16 and the ARC layer. In some embodiments, the sacrificial film 18 may comprise poly-silicon, silicon nitride, or silicon oxide.

Figure 2B:
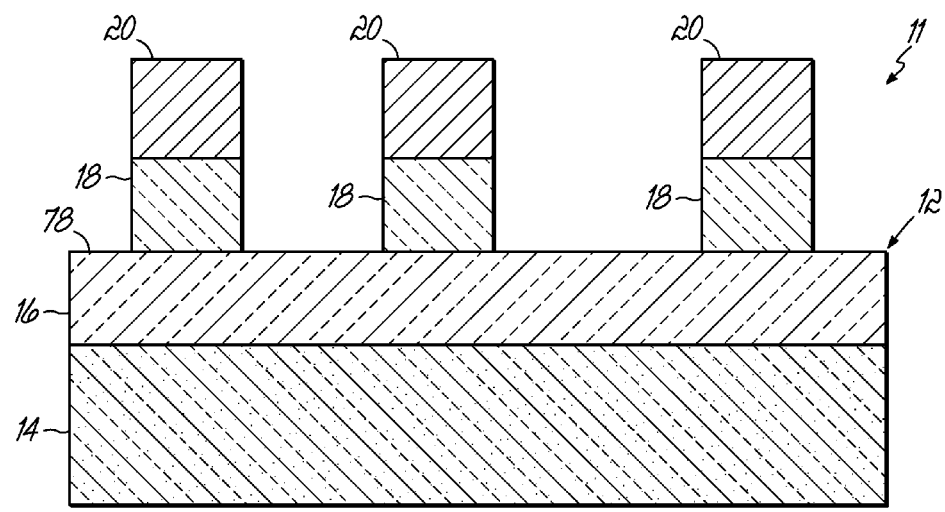
Figure 2C:
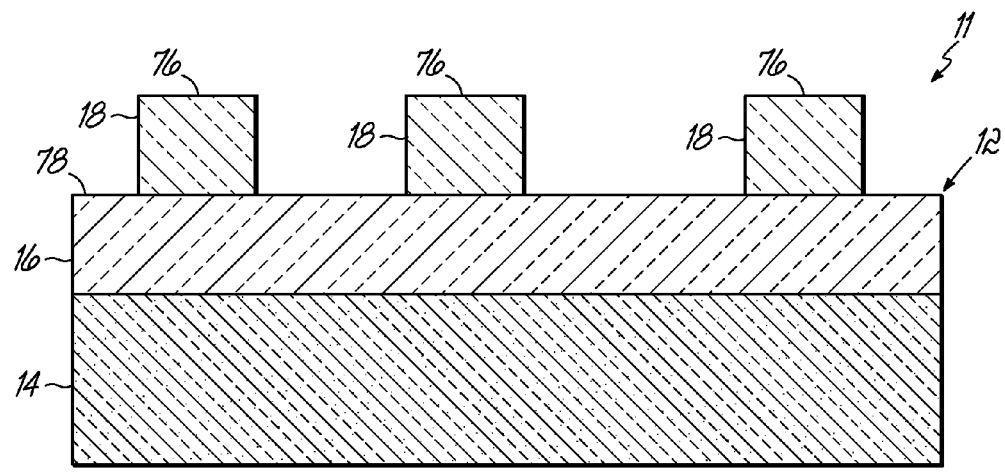
Figure 2D:
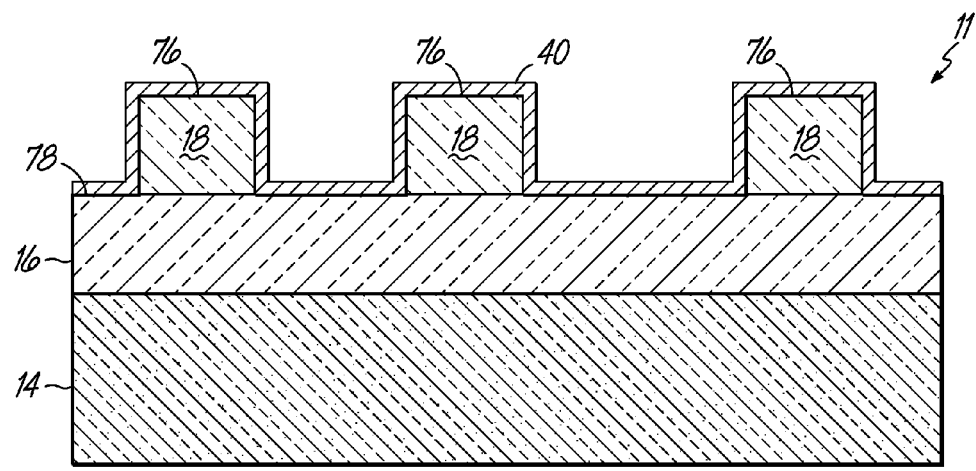

Additionally, according to another embodiment of the invention, the ARC layer, when etched, has mechanical properties that are sufficient to withstand the stresses associated with the deposition of a first spacer layer 40 (FIG. 2D). For example, the silicon-containing ARC material, described above, may be generally stronger than standard organic ARC materials and may provide better selectivity between the photo-resist and ARC layer. Hence, the silicon-containing ARC material will be better able to withstand the stripping/ashing plasma and the stress induced during deposition of a spacer layer, thereby allowing for better profile control. Suitable materials for use in the ARC layer include, for example, antireflective coatings containing silicon that are commercially available from Dow Corning, Brewer Science, Inc., JSR Corp., Rohm and Haas, and Shin Etsu Chemical Co., Ltd.

Alternatively, rather than a silicon-containing ARC layer, the sacrificial film 18 may include a multi-layer arrangement that includes one or more silicon compounds and one or more materials that have anti-reflective properties, such as amorphous carbon. The silicon compounds add strength and selectivity to the multiple sacrificial films.

The sacrificial film 18 may be applied and selectively removed by a wet-patterning process using a coating/developing system, though the embodiment is not so limited. For example, in another embodiment, the sacrificial film 18 may be applied and selectively removed by a dry-patterning process comprising a coating/developing system in combination with a dry etch tool. In one embodiment, a thickness of the sacrificial film 18 may be between about 50 nanometers and about 100 nanometers. In another embodiment, the thickness of the sacrificial film 18 may be between about 20 nanometers and about 50 nanometers. In an alternative embodiment, the thickness of the sacrificial film 18 may be between about 100 nanometers and about 300 nanometers.

Referring still to FIG. 2A, the photo-resist layer 20 may comprise 248 nm (nanometer) resists, 193 nm resists, 157 nm resists, or EUV (extreme ultraviolet) resists. The photo-resist layer 20 may be formed using a track system, such as those tracks systems that were described previously. Other systems and methods for forming a photo-resist layer 20 on a substrate 14 are well known to those skilled in the art of spin-on resist technology. The coating of the photo-resist layer 20 may include any or all processes known to those skilled in the art of preparing such films including, but not limited to, performing a cleaning process prior to the coating process, performing a post-application bake ("PAB") following the coating process, etc.

An optional hardmask layer (not shown) may be included and comprise a silicon oxide ($SiO_x$), a silicon nitride ($SiN_x$), a silicon carbide ($SiC_x$), a silicon oxynitride ($SiO_xN_y$), a silicon carbonitride ($SiC_xN_y$), or an amorphous carbon, or any combination of two or more thereof. These materials may be deposited using a CVD process.

An optional planarization layer (not shown) may include an OPL comprised of a photo-sensitive organic polymer or an etch type organic compound, but is not so limited. For instance, the photo-sensitive organic polymer may be polyacrylate resin, epoxy resin, phenol resin, polyamide resin, polyimide resin, unsaturated polyester resin, polyphenylether resin, polyphenylenesulfide resin, or benzocyclobutene ("BCB"). These materials may be formed using spin-on techniques.

Referring still to FIG. 1 and FIG. 2A, in 24, an image pattern is created in the photo-resist layer 20 using standard photolithographic techniques, as known to those of ordinary skill in the art. For example, the photo-resist layer 20 may be exposed to electromagnetic radiation, through a reticle in a dry or wet photo-lithography system (not shown), to create an image of the pattern using any suitable conventional stepping lithographic system, or scanning lithographic system. For example, the photo-lithographic system may be commercially-available from ASML Netherlands B. V. (Veldhoven, The Netherlands), or Canon USA, Inc., Semiconductor Equipment Division (San Jose, Calif.). The photo-resist layer 20 is then developed to form the image pattern using a developing solvent in a developing system, such as the track systems described above, to remove the imaged (irradiated) portions. The developing of the photo-resist layer 20 may include any or all processes known to those skilled in the art of preparing such films including, but not limited to, performing a post-exposure bake ("PEB") prior to the developing process, performing a hard bake following the developing process, etc.

With the photo-resist layer 20 developed, and now with reference to FIGS. 1 and 2B, in 26, the image pattern developed in the photo-resist layer 20 is transferred to the underlying sacrificial film 18, in this case the ARC layer, using an etching or stripping process. The etching process may include any combination of wet or dry etching processes as are known to those having ordinary skill in the art. The dry etching processes may include dry plasma etching processes or dry non-plasma etching processes or combinations thereof. For example, fluoro-carbon chemistry or halogen-containing chemistry may be used to etch the sacrificial film 18. Additionally, for example, a $C_xF_y$-based process chemistry, or a $C_xF_yH_z$-based process chemistry, or both may be used to etch sacrificial film 18. More specifically, and in accordance with one embodiment, $CH_2F_2$ and $CHF_3$ may be used to etch a silicon-containing sacrificial film 18. Still further, a $SF_6$-based chemistry may be used to etch the sacrificial film 18.

Also in 26, the photo-resist layer 20 is removed from the sacrificial film 18, as shown in FIG. 2C. If so desired, in 28, the sacrificial film 18 may be trimmed using an etching process. For example, a plasma oxygen or fluorocarbon chemistry may be used to trim the sacrificial film 18 to a width that may be comparable to the final pitch of the multi-layer pattern.

If so desired, a second sacrificial film (not shown) may be formed on the etched first sacrificial film. In that regard, if the decision in 30 is "YES" to deposit a second sacrificial film, the process returns to the process described previously in 15, 24, 26, and 28. The second sacrificial film may comprise the same materials and same deposition method as the first sacrificial film or may differ in the material and/or the method. If a second sacrificial film is not desired (i.e., the decision is "NO"), then method 10 continues.

Referring now to FIGS. 1 and 2D, in 42, a first spacer layer 40 is conformally formed on the sacrificial film 18. The technique of conformally depositing the first spacer layer 40 may include a monolayer deposition ("MLD") method. The MLD method may include, for example, an ALD method, which is based on the principle of the formation of a saturated monolayer of reactive precursor molecules by chemisorption. A typical MLD process for forming an AB film, for example, consists of injecting a first precursor or reactant A ("$R_A$") for a period of time in which a saturated monolayer of A is formed on the substrate. Then, $R_A$ is purged from the chamber using an inert gas, $G_i$. A second precursor or reactant B ("$R_B$") is then injected into the chamber, also for a period of time, to combine B with A and form the layer AB on the substrate. $R_B$ is then purged from the chamber. This process of introducing precursors or reactants, purging the reactor, introducing another or the same precursors or reactants, and purging the reactor may be repeated a number of times to achieve an AB film of a desired thickness. The thickness of an AB film deposited in each ALD cycle may range from about 0.5 angstrom to about 2.5 angstrom. In some embodiments, the first spacer layer 40 may contain silicon dioxide, silicon nitride, or a high-k material (e.g., hafnium oxide, hafnium silicate, zirconium oxide, etc.).

In some embodiments, the MLD process when forming an AB film may include injecting a precursor containing ABC, which is adsorbed on the substrate during the first step, and then removing C during the second step.

Figure 3:
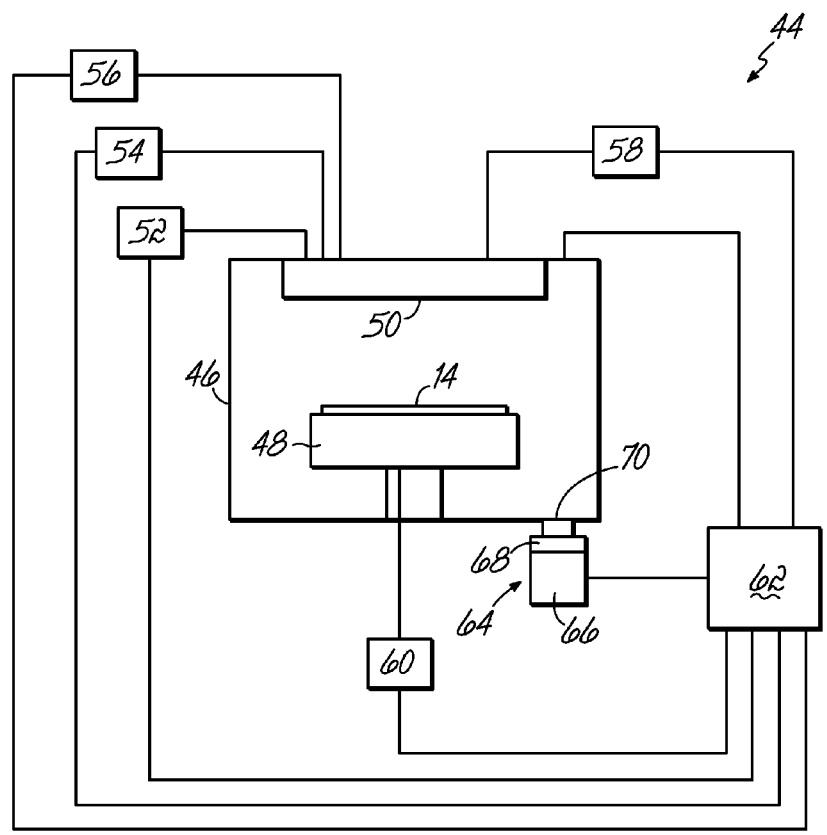
FIG. 3 is a schematic view of an Atomic Layer Deposition system for use with one or more embodiments of the present invention.

In accordance with one embodiment of the invention, the first spacer layer 40 may comprise silicon dioxide that is deposited by an ALD deposition process in an ALD system 44, one example of which is shown in FIG. 3, which includes a process chamber 46 having a substrate holder 48 configured to support the substrate 14 thereon. The process chamber 46 further contains an upper assembly 50 (for example, a shower head) coupled to a first process material supply system 52, a second process material supply system 54, a purge gas supply system 56, and one or more auxiliary gas supply systems 58 (which may include an oxygen-containing gas, a nitrogen-containing gas, or other as necessary for depositing the desired spacer layer material), and a substrate temperature control system 60.

Alternatively, or in addition, a controller 62 may be coupled to one or more additional controllers/computers (not shown), which may obtain setup and/or configuration information from the additional controllers/computers. The controller 62 may be used to configure any number of the processing elements 52, 54, 56, 58, 60, and may collect, provide, process, store, and/or display data from the same. The controller 62 may comprise a number of applications for controlling one or more of the processing elements 52, 54, 56, 58, 60, and may, if desired, include a graphical user interface ("GUI," not shown) that may provide an easy to use interface for a user to monitor and/or control one or more of the processing elements 52, 54, 56, 58, 60.

The process chamber 46 is further coupled to a pressure control system 64, including a vacuum pumping system 66 and a valve 68, through a duct 70, wherein the pressure control system 64 is configured to controllably evacuate the process chamber 10 to a pressure suitable for forming the first spacer layer 40 (FIG. 2D) and suitable for use of the first and second process materials. The vacuum pumping system 66 may include a turbo-molecular vacuum pump ("TMP") or a cryogenic pump that is capable of a pumping speed up to about 5000 liters per second (and greater) and the valve 68 may include a gate valve for throttling the chamber pressure. Moreover, a device (not shown) for monitoring the chamber process may be coupled to the processing chamber 46, which may include, for example, a Type 628B Baratron absolute capacitance manometer, which is commercially-available from MKS Instruments, Inc. (Andover, Mass.). The pressure control system 64 may, for example, be configured to control the process chamber pressure between about 0.1 Torr and about 100 Torr during an ALD process.

The first and second material supply systems 52, 54, the purge gas supply system 56, and each of the one or more auxiliary gas supply systems 58 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. According to embodiments of the invention, gases may be sequentially and alternately pulsed into the processing chamber 46, where the length of each gas pulse may, for example, be between about 0.1 second and about 100 seconds. Alternately, the length of each gas pulse may be between about 1 second and about 10 seconds. Exemplary gas pulse lengths for oxygen- and nitrogen-containing gases may be between about 0.3 second and about 3 seconds, for example, about 1 second. Exemplary purge gas pulses may be between about 1 second and about 20 seconds, for example, about 3 seconds. An exemplary pulsed gas injection system is described in greater detail in pending U.S. application Ser. No. 10/569,592, published as U.S. Application Publication No. 2004/0123803.

Still referring to FIG. 3, the controller 62 may comprise a microprocessor, memory, and a digital I/O port capable of generating control voltages sufficient to communicate and activate inputs to the ALD system 44, as well as monitor outputs from the ALD system 44. Moreover, the controller 62 may be coupled to and may exchange information with the process chamber 46, the substrate holder 48, the upper assembly 50, the processing elements 52, 54, 56, 58, the substrate temperature controller 60, and the pressure control system 64. For example, a program stored in a memory of the controller 62 may be utilized to activate the inputs to the aforementioned components of the ALD system 44 according to a process recipe in order to perform a deposition process. One example of the controller 62 is a DELL PRECISION WORKSTATION 610™, commercially-available from Dell Corp., (Austin, Tex.).

However, the controller 62 may be implemented as a general purpose computer system that performs a portion or all of the microprocessor-based processing steps of the present invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 62 includes at least one computer readable medium or memory, such as the controller memory, for holding instructions programmed according to the teachings of the invention and for containing data structures, tables, records, or other data that may be necessary to implement the present invention. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 62, for driving a device or devices for implementing the present invention, and/or for enabling the controller 62 to interact with a human user. Such software may include, but is not limited to, device drivers, operating systems, development tools, and applications software. Such computer readable media further includes the computer program product of the present invention for performing all or a portion (if processing is distributed) of the processing performed in implementing the present invention.

The computer code devices may be any interpretable or executable code mechanism, including but not limited to scripts, interpretable programs, dynamic link libraries ("DLLs"), Java classes, and complete executable programs. Moreover, parts of the processing of the present invention may be distributed for better performance, reliability, and/or cost.

The term "computer readable medium" as used herein refers to any medium that participates in providing instructions to the processor of the controller 62 for execution. Thus, computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 62 for execution. For example, the instructions may initially be carried on a magnetic disk of a remote computer. The remote computer can load the instructions for implementing all or a portion of the present invention remotely into a dynamic memory and send the instructions over a network to the controller 62.

The controller 62 may be locally located relative to the ALD system 44, or it may be remotely located relative to the ALD system 44. For example, the controller 62 may exchange data with the ALD system 44 using at least one of a direct connection, an intranet, the Internet and a wireless connection. The controller 62 may be coupled to an intranet at, for example, a customer site (i.e., a device maker, etc.), or it may be coupled to an intranet at, for example, a vendor site (i.e., an equipment manufacturer). Additionally, for example, the controller 62 may be coupled to the Internet. Furthermore, another computer (i.e., controller, server, etc.) may access, for example, the controller 62 to exchange data via at least one of a direct connection, an intranet, and the Internet. As also would be appreciated by those skilled in the art, the controller 62 may exchange data with the ALD system 44 via a wireless connection.

Returning again to FIG. 2D, with reference also to FIG. 3, deposition of the first spacer layer 40, and in particular, a silicon dioxide spacer layer, may proceed by sequential and alternating pulse sequences to deposit the different components (here, for example, silicon and oxygen) of the first spacer layer material. Since ALD processes typically deposit less than a monolayer of the component per gas pulse, it is possible to form a homogenous material using separate deposition sequences of the different components of the film. Each gas pulse may include a respective purge or evacuation step to remove unreacted gas or byproducts from the process chamber 46. According to other embodiments of the present invention, one or more of the purge or evacuation steps may be omitted.

Therefore, and as one exemplary embodiment, the substrate 14 with the processed sacrificial film 18 is disposed in the process chamber 46 of the ALD system 44 and sequentially exposed to a gas pulse containing silicon and a gas pulse of an oxygen-containing gas, the latter of which may include $O_2$, $H_2O$, $H_2O_2$, ozone, plasma-exited oxygen (such as for use in PEALD systems), or a combination thereof, and optionally an inert gas, such as argon (Ar).

The silicon may react on the surface of the sacrificial film 18 to form a chemisorbed layer that is less than a monolayer thick. The oxygen from the gas pulse of the oxygen-containing gas may then react with the chemisorbed surface layer. By repeating this sequential gas exposure, i.e., by alternating the two exposures a plurality of times, it is possible to achieve layer-by-layer growth of about 1 angstrom ($10^{-10}$ meter) per cycle until a desired thickness is achieved.

Figure 2E:
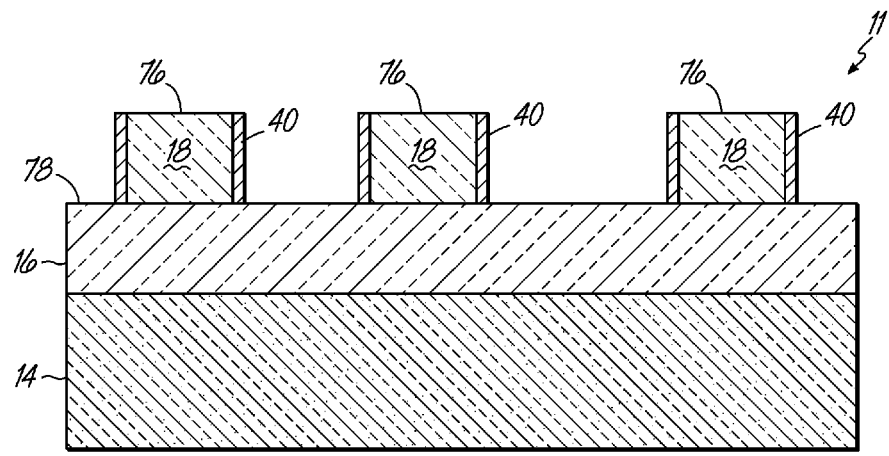

Referring still to FIG. 2D, and now also with reference to FIG. 2E, with the first spacer layer deposition complete, a partial spacer etch process may be used to remove one or more horizontal surfaces of the deposited first spacer layer 40. More specifically, and as shown in FIG. 2E, the first spacer layer material deposited on the horizontal surface 76 of the sacrificial film 18 and the horizontal surface 78 of the thin film 16 is removed, such as by an etching process, while substantially leaving vertical portions of the first spacer layer 40. The removal process may include dry plasma etching, dry non-plasma etching, or combinations thereof. More specifically, the first spacer layer 40 may be etched using fluorocarbon chemistry or fluoro-hydrocarbon chemistry, or both. Alternatively, and as described in greater detail below, only the first spacer layer material deposited on the horizontal surface 76 of the sacrificial film 18 may be removed, such as by a planarization technique. The vertical portions of the first spacer layer 40 may have an aspect ratio ranging from about 1 to about 100. The aspect ratio may depend on the material used and the type of device being manufactured.

Figure 2F:
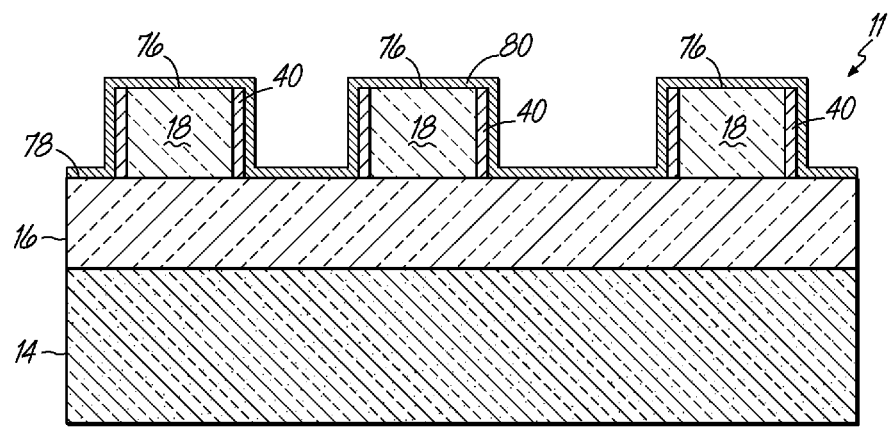
Figure 2G:
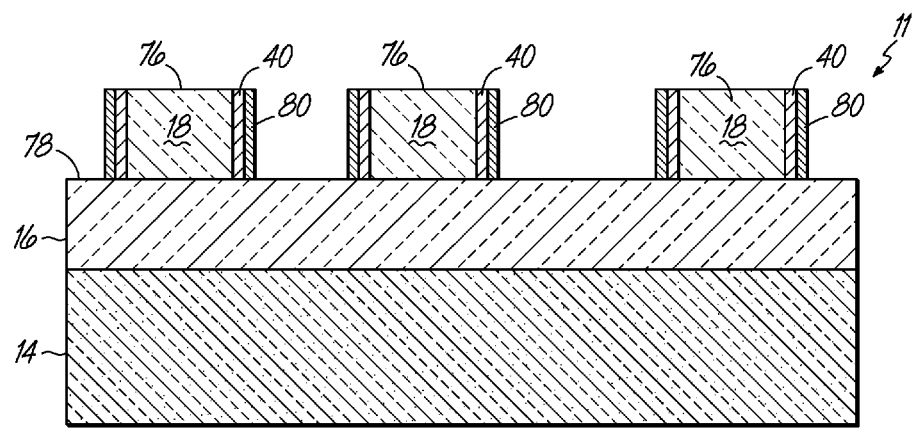

In 82, as illustrated in FIGS. 2F and 2G, the conformal deposition and etching of a second spacer layer 80 may then proceed in a manner as described above may, for example, comprise a silicon nitride material. More specifically, sequential and alternating pulse sequences may be used to deposit the different components (here, for example, silicon and nitrogen) of the second spacer layer material. The sequential and alternating deposition continues until a desired thickness is achieved. Then, a partial spacer etch process may be used to remove one or more horizontal surfaces of the deposited first spacer layer 40 while substantially leaving vertical portions of the second spacer layer 80. That is, and as shown in FIG. 2G, the second spacer layer material deposited on the horizontal surface 76 of the sacrificial film 18 and the horizontal surface 78 of the thin film 16 are removed, such as by an etching process. Alternatively, and as described in greater detail below, only the second spacer layer material deposited on the horizontal surface 76 of the sacrificial film 18 may be removed. The vertical portions of the second spacer layer 80 may have an aspect ratio ranging from about 1 to about 100. In some embodiments, the second spacer layer 80 may comprise silicon dioxide, silicon nitride, or a high-k material (e.g., hafnium oxide, hafnium silicate, zirconium oxide, etc.).

Figure 4A:
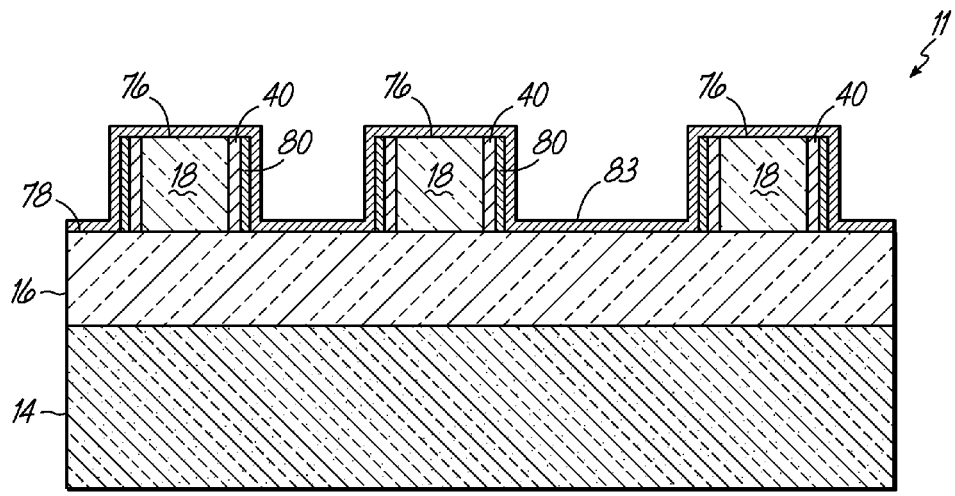
FIGS. 4A-4B illustrate, schematically, an alternate method of patterning the thin film on the substrate of FIGS. 2A-2G.
Figure 4B:
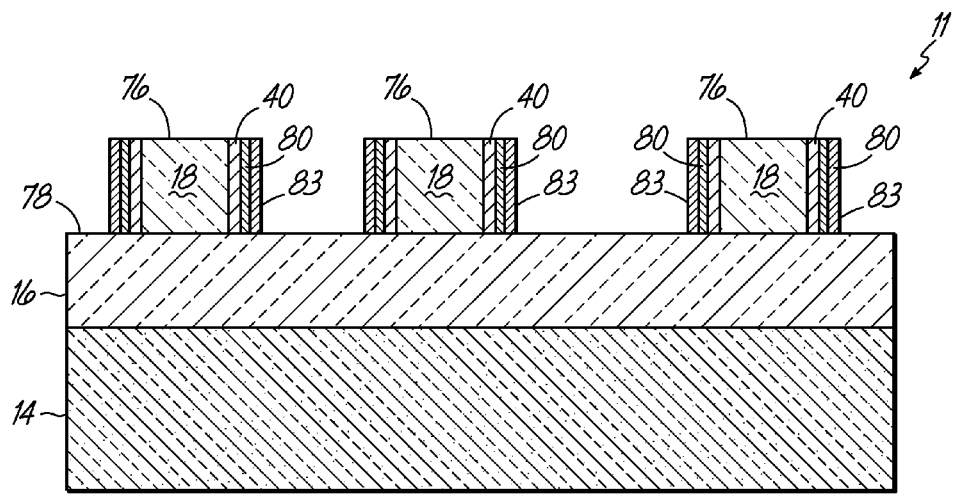

If desired, in optional 84, a first or third spacer layer 40, 83 may be deposited and etched in a manner that is similar to the method used for the first and second spacer layers 40, 80, and as is shown in FIGS. 4A and 4B.

Figure 2H:
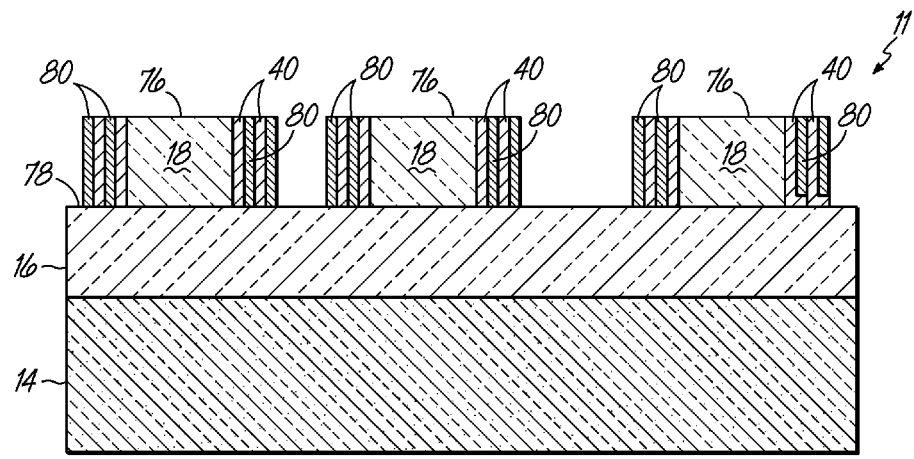

Turning now to FIG. 2H, with continued reference to FIG. 1, the method 10 may be repeated one or more times until desired number of spacer layers are formed on the sacrificial film 18. As shown, the decision in 86 was that the spacer layer formation was not complete, and so the method 10 may (1) optionally return to sequentially and conformally deposit additional first and second spacer layers 40, 80 (in 42 and 82), with or without additional first or third spacer layers 40, 83 (in 84); or (2) optionally, and as shown in phantom, return to conformally deposit an additional second spacer layer 80 (in 82), with or without additional first and third spacer layers 40, 83 (in 84). Once the decision in 86 is "YES," that is layer formation is complete, the method 10 continues.

Figure 2I:
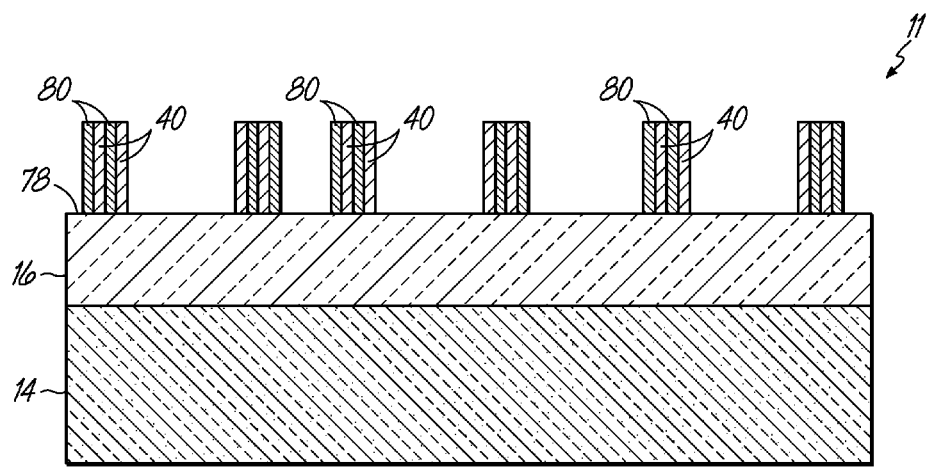

In that regard, and with reference now to FIGS. 1 and 2I, those portions of the sacrificial film 18 not overlaid by a spacer layer material, are removed in 88, such as by an etching process. For example, the etching process may include any combination of wet or dry etching processes, as are known to those of ordinary skill the art. The dry etching processes may include dry plasma etching processes, dry non-plasma etching processes, or combinations thereof. For example, fluorocarbon chemistry or halogen-containing chemistry may be used to etch the remaining sacrificial film material. Additionally, for example, a $C_xF_y$-based process chemistry, or a $C_xF_yH_z$-based process chemistry, or both may be used. Additionally yet, for example, $CH_2F_2$ and $CHF_3$ may be used to etch the remaining sacrificial film material. Further, a $SF_6$-based chemistry may be used to etch the remaining sacrificial film material.

Figure 2J:
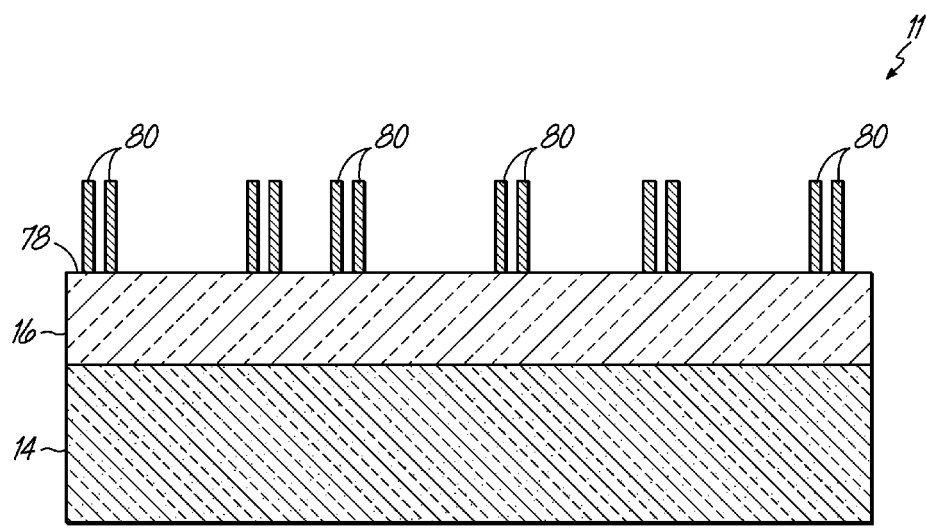

With the sacrificial film 18 removed, and the vertical portions of the spacer layers 40, 80 remaining, the first or second spacer layer 40, 80 is removed in 90 and the third spacer layer 83, if present, is removed in 92. More specifically, and depending on the particular desired pattern structure, one of the first and second layers 40, 80, and optionally, the third spacer layer 83 (if appropriate), may be removed, such as by etching. For example, as shown in FIG. 2J, the first spacer layer material 40 is removed while the second spacer layer material remains. Thus, the second spacer layer material may comprise a hardmask material that resists etching. Though not shown, it would be understood that the reverse may also be true, i.e., the first spacer layer material may comprise a hardmask material and the second spacer layer 80 is removed.

Removal of the first spacer layer 40 may proceed in accordance with the various etching methods described herein or other removal methods, as would be known to those of ordinary skill in the art.

Figure 2K:
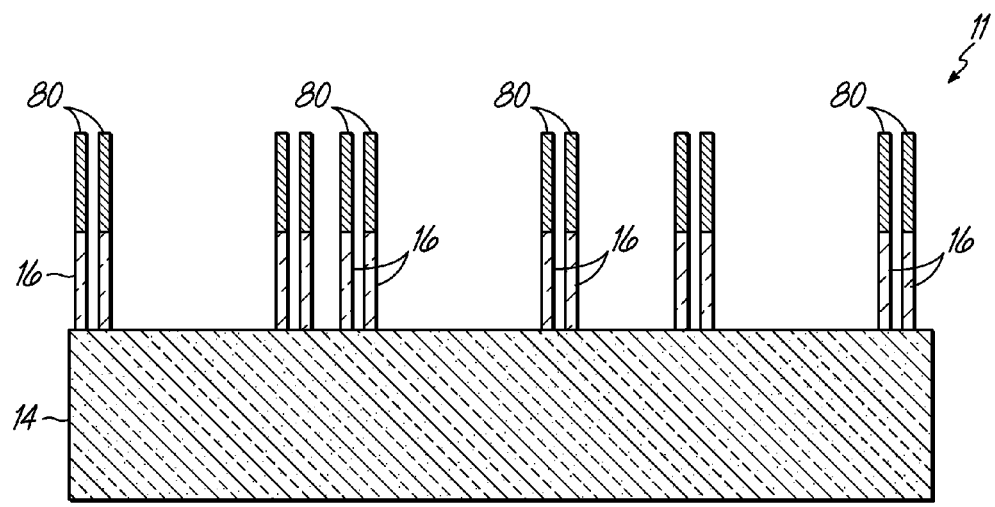

With formation of the pattern structure complete, i.e., only the vertical portions of the second spacer layer 80 remaining, the device 11 may be further processed in 94 as desired. In one exemplary embodiment of the present invention, and as shown in FIG. 2K, the vertical portions of the second spacer layer 80 may be used as a mask to transfer the image pattern to at least a portion of the underlying layers. Specially, the thin film 16 and, if desired, the substrate 14, may be etched. Additional or alternative processes may then ensue.

Turning now to FIGS. 5 and 6A-6E, a method 100 in accordance with another embodiment of the present invention is described. While not specifically shown, it would be understood that the method 100, as schematically illustrated in the flow chart of FIG. 5, may proceed from the method 10 (FIG. 1) described previously, and, more specifically, may follow from a decision in 30 that a second sacrificial film is not desired and as indicated with reference to Block A. In that regard, in 110, a first spacer layer 102 may be formed on an imaged sacrificial film 104 residing on a thin film 106 and a substrate 108. The first spacer layer 102 may be formed by a CVD process, a PECVD process, an ALD process, a PEALD process, or more generally, a monolayer deposition process. In accordance with this particular embodiment of the present invention, the first spacer layer 102 is generally formed to a thickness that is greater than the thickness of the first spacer layer 40 (FIG. 2D), though this is not required. Thicknesses of the first spacer layer 102 may range from about 1 nm to about 50 nm.

Figure 6A:
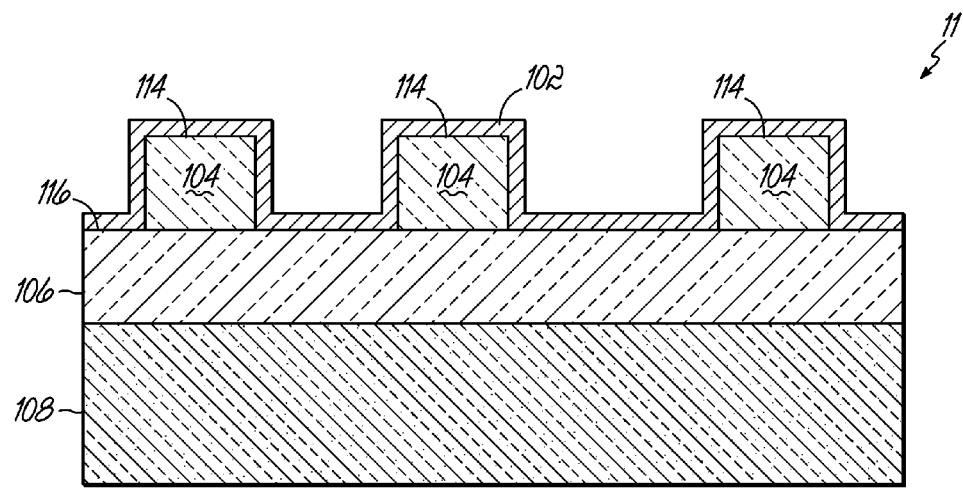
FIGS. 6A-6E illustrate, schematically, a method of patterning a thin film on a substrate in accordance with one method embodiment of FIG. 5.
Figure 6B:
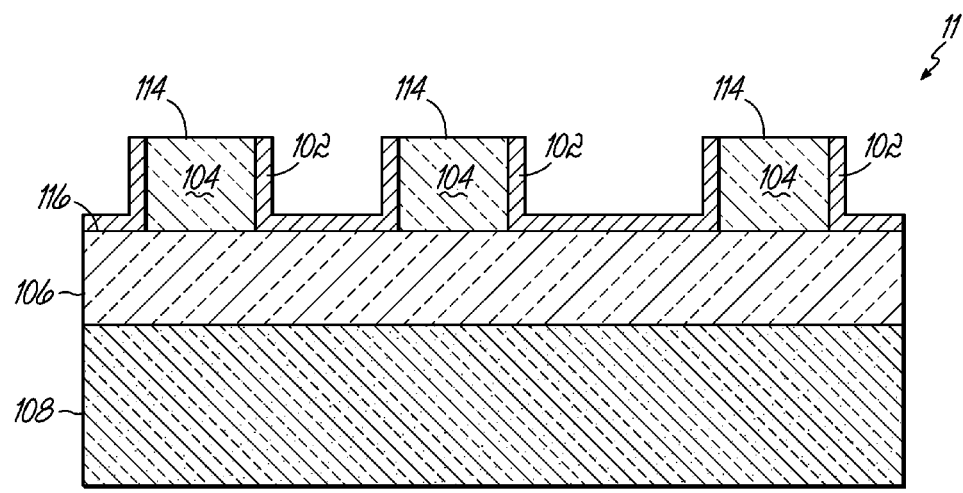
Figure 6C:
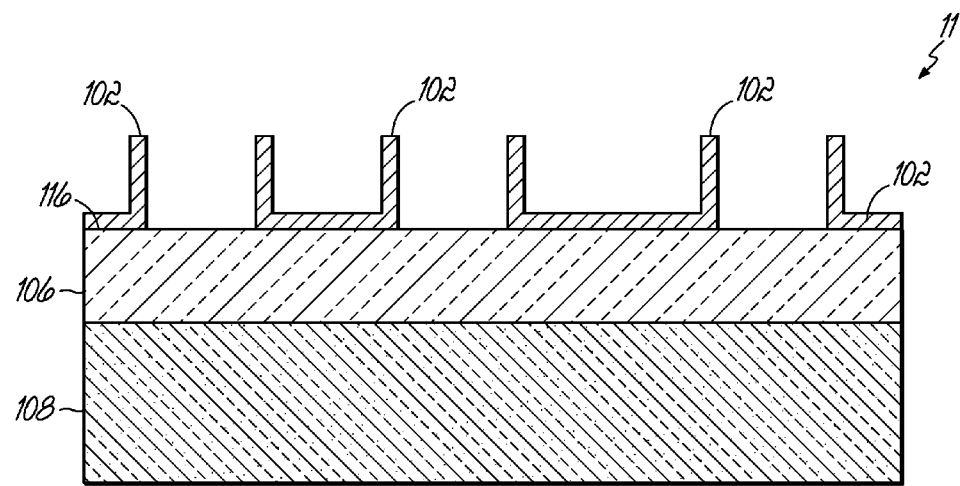
Figure 7A:
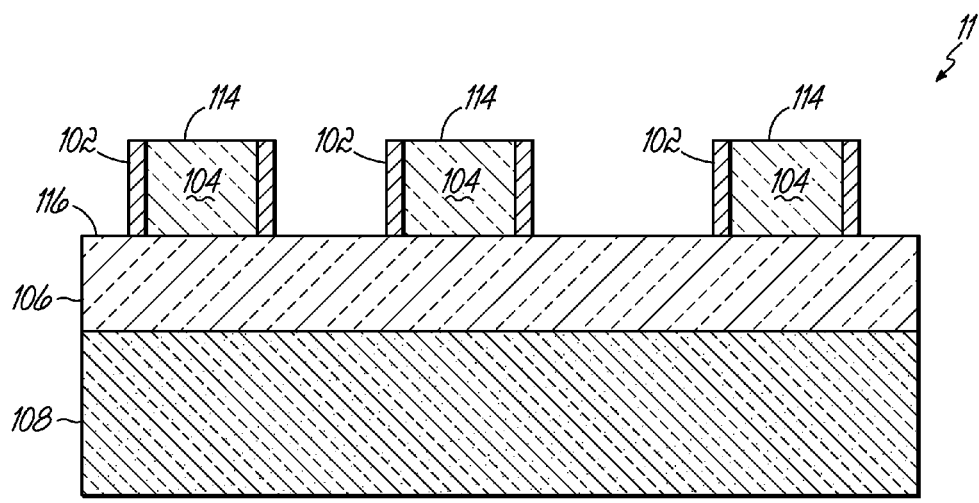
FIGS. 7A-7C illustrate, schematically, a method of patterning a thin film on a substrate in accordance with another method embodiment of FIG. 5.

With the first spacer layer deposition complete, in 112, one or more of the horizontal surfaces of the first spacer layer 102 may be etched. For example, as shown in FIG. 6B, the horizontal portion of the first spacer layer 102 is removed from only the horizontal surface 114 of the sacrificial film 104, such as by a planarization method, while leaving vertical portions of the first spacer layer 102 and horizontal portions of the sacrificial film 104 adjacent (or otherwise over) a horizontal surface 116 of the thin film 106. Alternatively, and as shown in FIG. 7A, the horizontal portion of the first spacer layer 102 is removed from the horizontal surfaces 114, 116 of the sacrificial film 104 and the thin film 116, such as by an etching process, while substantially leaving the vertical portions of the first spacer layer 102.

Figure 6D:
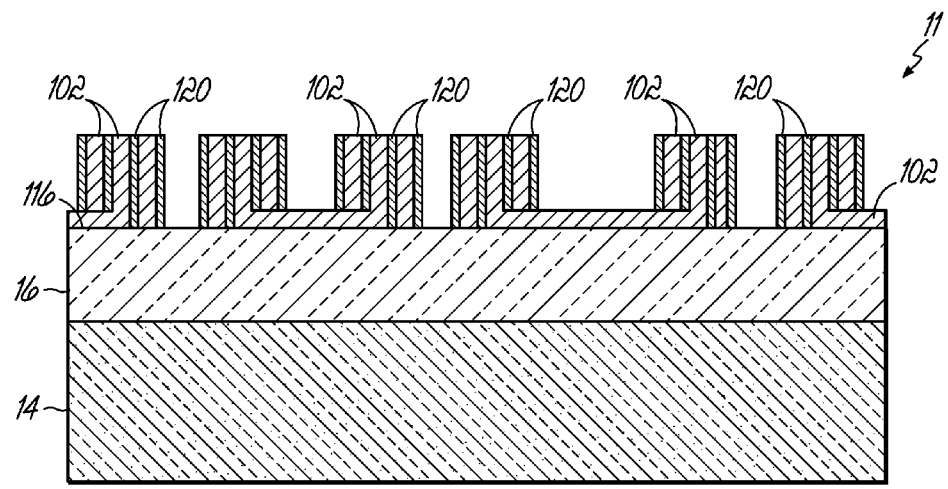
Figure 6E:
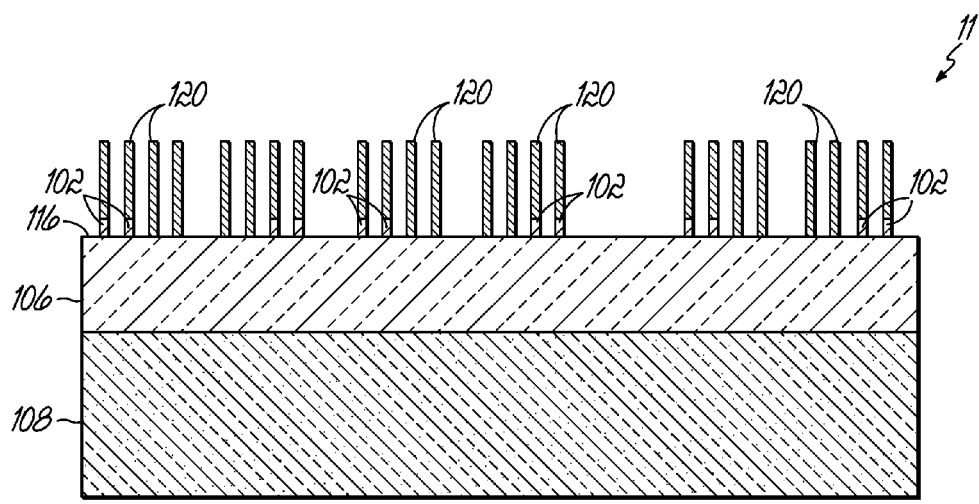
Figure 7B:
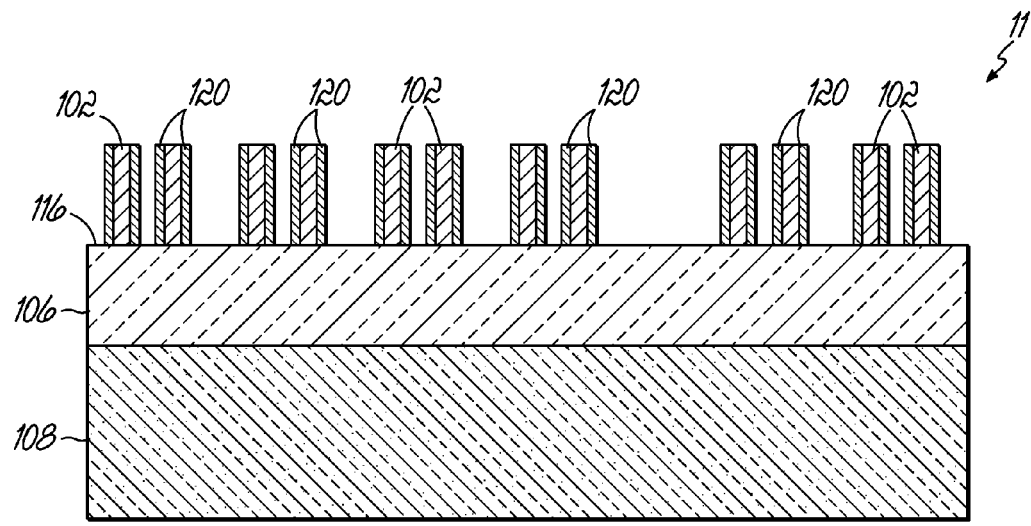
Figure 7C:
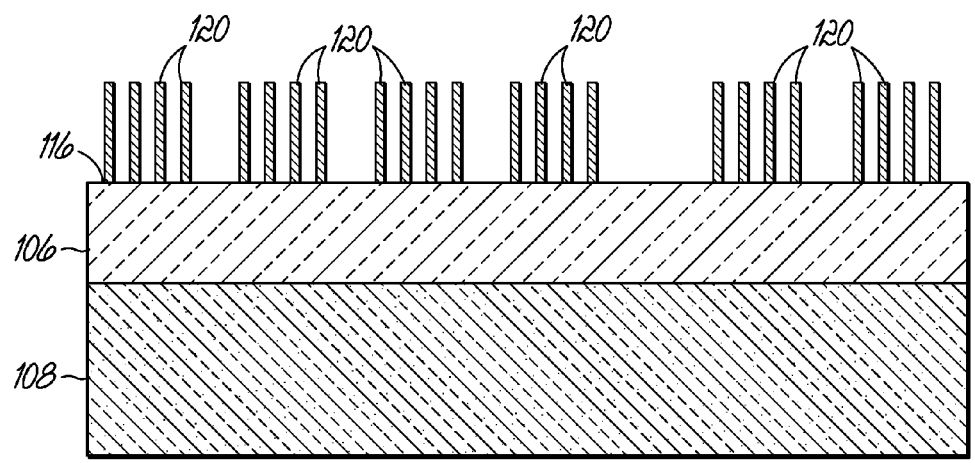

In any event, the method 100 continues in 118 with removing the sacrificial film 104, such as in accordance with the methods described previously and as shown in FIG. 6C. With the sacrificial film 104 removed, in 122 a second spacer layer 120 may be conformally formed, for example, by an MLD process, and subsequently etched to remove horizontal portions as was described in detail above. Etching of the second spacer layer 120 is then followed, in 124, by conformally depositing of a second layer of the first spacer layer 102 and subsequently etching away the horizontal portions as shown in FIGS. 6D and 7B. If so desired, in optional 126, a second or third spacer layer 120, 83 (FIG. 4A) may also be formed. The method 100 may be repeated one or more times until a desired number of spacer layers are formed. As shown, the decision in 128 was that the spacer layer formation was not complete, and so the method 100 may (1) optionally return to sequentially and conformally deposit additional second and first spacer layers 120, 102 (in 122 and 124), with or without additional second or third spacer layers 120, 83 (FIG. 4A) (in 126); or (2) optionally, and as shown in phantom, return to conformally deposit an additional first spacer layer 102 (in 124), with or without additional second and third spacer layers 120, 83 (FIG. 4A) (in 126). Once the decision in 128 is "YES," that is layer formation is complete, the method 100 may continue as indicated with reference to Block B, e.g., by returning to method 10 in FIG. 1 and proceeding with removing the first or second spacer layer 102, 120 in 90, as shown in FIGS. 6E and 7C, and with further processing in 94.

Figure 8:
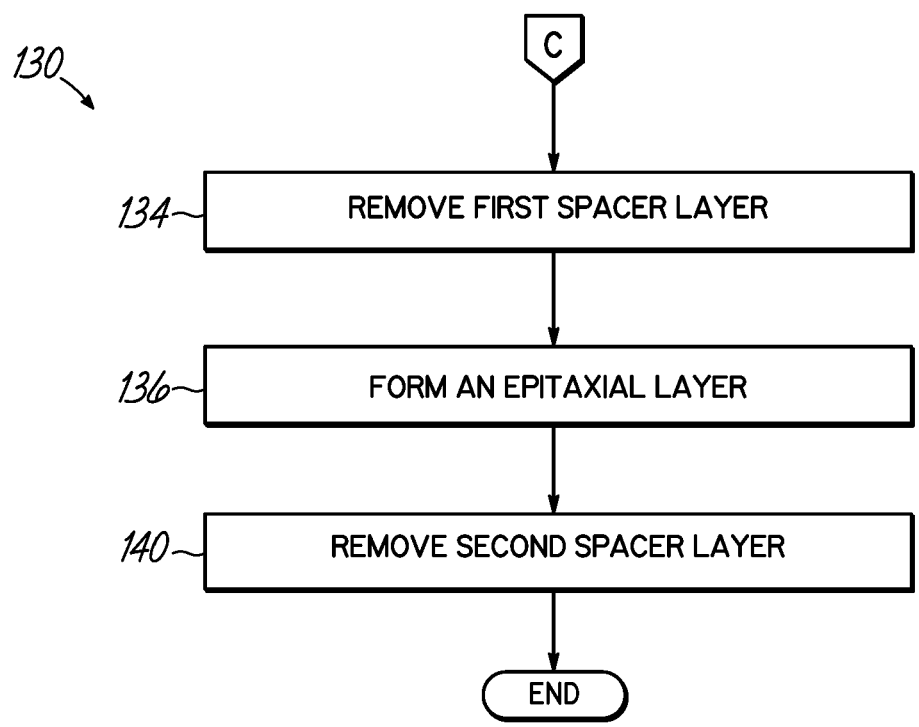
FIG. 8 is a flow chart illustrating a method of patterning a thin film on a substrate in accordance with still another embodiment of the present invention.
Figure 9A:
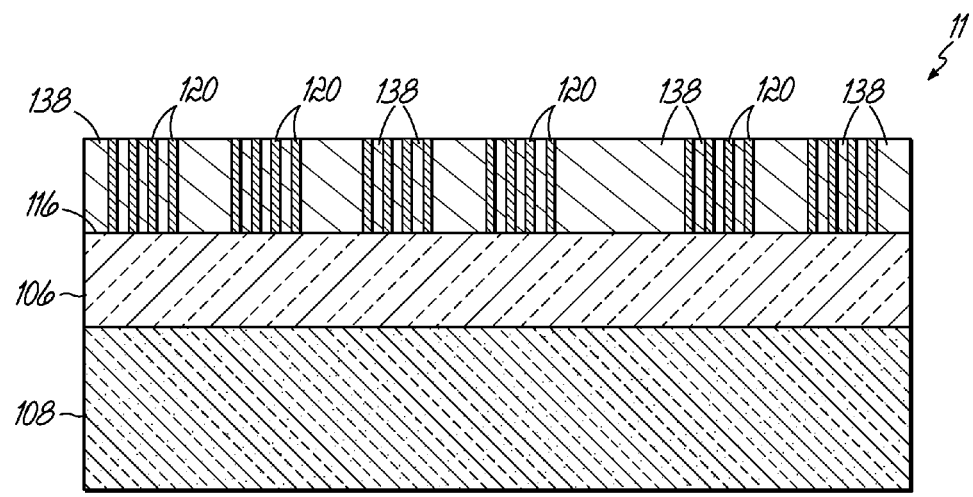
FIG. 9A-9B illustrate, schematically, a method of patterning a thin film on a substrate in accordance with the method of FIG. 8.

Alternatively, as represented by Block C in FIG. 1, and in accordance with the method 130 described with reference to the flow chart of FIG. 8, after the sacrificial film 18 is removed in 88 in method 10 of FIG. 1 or after a "YES" decision in 128 in method 100 of FIG. 5, the first spacer layer 102 (or 40) is removed in 134, then an epitaxial layer 138, as shown in FIG. 9A, may be formed in 136. The expitaxial layer 138 may include silicon, doped silicon, graded-doped silicon, SiGe, or graded SiGe. More specifically, a selective epitaxial growth process may include introducing a gas mixture containing silicon (e.g., dichlorosilane and HC1) into the processing chamber. The pressure (e.g., about 10 mTorr to about 10 Torr, or possibly higher) of the mixed gas within the processing chamber, along with chamber temperature (e.g., in the case of dichlorosilane and HC1, between about 500° C. and 800° C.) facilitates the selective growth of a crystalline layer (for example, a silicon crystal layer (e.g., epitaxial silicon, doped epitaxial silicon, SiGe, or doped SiGe) on the silicon substrate 108 but not the second spacer layer 120 (or 80).

Figure 9B:
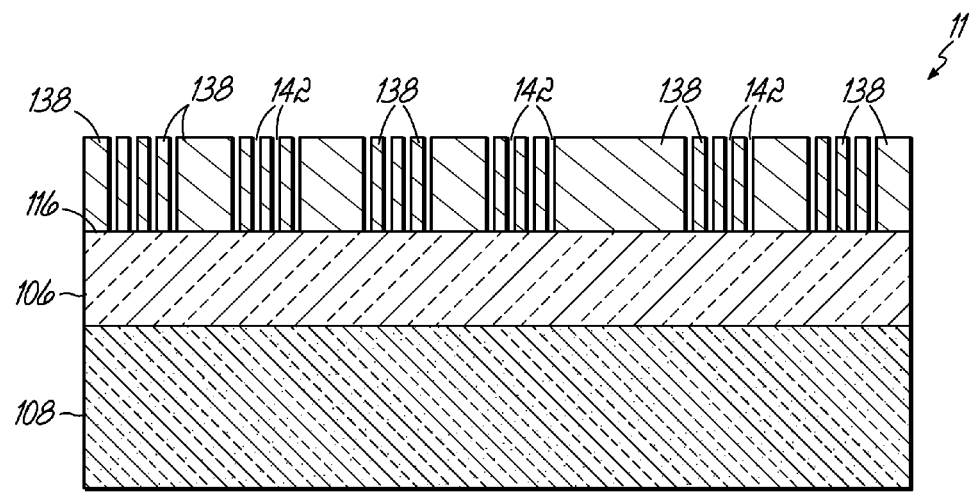

After epitaxial growth is complete, and as shown in FIG. 9B, the second spacer layer 120 (or 80) is removed in 140 such that ultra thin features 142 are formed in the epitaxial layer 138. Such thin features 142 may be suitable for use in, for example, FINFET devices, quantum transistors, depleted transistors, or other like devices.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of patterning a substrate, the method comprising:
    a) forming a sacrificial film over a substrate;
    b) creating a pattern in the sacrificial film;
    c) sequentially first, conformally depositing a first spacer layer over the patterned sacrificial film, and second, removing at least one horizontal portion of the first spacer layer while substantially leaving vertical portions of the first spacer layer;
    d) removing portions of the sacrificial film not overlaid by the remaining portions of the first spacer layer;
    e) sequentially first, conformally depositing a second spacer layer over the remaining portions of the sacrificial film and the remaining portions of the first spacer layer, and second, removing at least one horizontal portion of the second spacer layer while substantially leaving vertical portions of the second spacer layer;
    f) optionally repeating c) and e) one or more times;

g) optionally repeating c); and h) removing one of the first or second spacer layers while substantially leaving the vertical portions of the remaining one of the first or second spacer layers.

2. The method of claim 1 wherein removing at least one horizontal portion of the first spacer layer in c) includes removing all horizontal portions overlying the patterned sacrificial film, and removing portions of the sacrificial film in d) includes completely removing the sacrificial film.

3. The method of claim 1, wherein forming a pattern in the sacrificial film further comprises:

depositing, imaging, and developing a photo-resist layer;

etching the sacrificial film in accordance with the imaged photo-resist layer; and removing the photo-resist layer.

4. The method of claim 1, wherein conformally depositing the first spacer layer includes a chemical vapor deposition process, a plasma-enhanced chemical vapor deposition process, an atomic layer deposition process, or a plasma-enhanced atomic layer deposition process.

5. The method of claim 4, wherein the first spacer layer comprises silicon dioxide, silicon nitride, or a high-k material.

6. The method of claim 1, wherein conformally depositing the second spacer layer includes an atomic layer deposition process, or a plasma-enhanced atomic layer deposition process.

7. The method of claim 6, wherein the second spacer layer comprises silicon nitride, silicon oxide, or a high-k material.

8. The method of claim 1, wherein removing at least one horizontal portion of the first spacer layer includes removing a horizontal portion over a top surface of the sacrificial film.

9. The method of claim 8, wherein removing the horizontal portion over the top surface of the sacrificial film further comprises a planarization process.

10. The method of claim 1, wherein removing at least one horizontal portion of the first spacer layer includes removing a horizontal portion over a top surface of the sacrificial film and a horizontal portion over a top surface of the substrate.

11. The method of claim 10, wherein removing the horizontal portions over the top surfaces of the sacrificial film and the substrate further comprises an etching process.

12. The method of claim 1, wherein a thin film is formed between the substrate and the sacrificial film, the method further comprising:

h) using the vertical portions of the remaining one of the first or second spacer layers as a mask to etch the thin film.

13. The method of claim 1 further comprising:

h) selectively forming an epitaxial layer over the substrate; and i) removing the vertical portions of the remaining one of the first or second spacer layers to form at least one feature in the epitaxial layer.

14. A method of patterning a substrate, the method comprising:

a) forming a sacrificial film over a substrate;

b) creating a pattern in the sacrificial film;

c) sequentially first, conformally depositing a first spacer layer over the substrate and the patterned first sacrificial film, and second, removing at least one horizontal portion of the first spacer layer while substantially leaving vertical portions of the first spacer layer;

d) removing portions of the sacrificial film not overlaid by the remaining portions of the first spacer layer;

e) sequentially first, conformally depositing a second spacer layer over the remaining portions of the sacrificial film and the remaining portions of the first spacer layer pattern, and second, removing at least one horizontal portion of the second spacer layer while substantially leaving vertical portions of the second spacer layer;

f) sequentially first, conformally depositing a third spacer layer over the remaining portions of the first spacer layer, the remaining portions of the second spacer layer, and the remaining portions of the sacrificial film, and second, removing at least one horizontal portion of the third spacer layer while substantially leaving vertical portions of the third spacer layer;

g) optionally repeating e) and f) one or more times;

h) optionally repeating e); and i) removing portions of the first and third spacer layers not overlaid by the second spacer layer.

15. The method of claim 14, wherein conformally depositing the first spacer layer includes a chemical vapor deposition process, a plasma-enhanced chemical vapor deposition process, an atomic layer deposition process, or a plasma-enhanced atomic layer deposition process.

16. The method of claim 14, wherein conformally depositing the second spacer layer or the third spacer layer includes an atomic layer deposition process, or a plasma-enhanced atomic layer deposition process.

17. The method of claim 14 further comprising:

j) selectively forming an epitaxial layer over the substrate; and k) removing the second spacer layer to form at least one feature in the epitaxial layer.

18. The method of claim 14, wherein the first spacer layer and the third spacer layer comprise the same spacer material.

19. The method of claim 14, wherein the first spacer layer has a first thickness, the second spacer layer has a second thickness, and the third spacer layer has a third thickness, the first thickness being greater than the second and third thicknesses.

* * * * *

UNITED STATES PATENT AND TRADEMARK OFFICE
CERTIFICATE OF CORRECTION

| | | |
|---|---|---|
| PATENT NO. | : 8,809,169 B2 | Page 1 of 1 |
| APPLICATION NO. | : 13/250937 | |
| DATED | : August 19, 2014 | |
| INVENTOR(S) | : David L. O'Meara et al. | |

Figure 5:
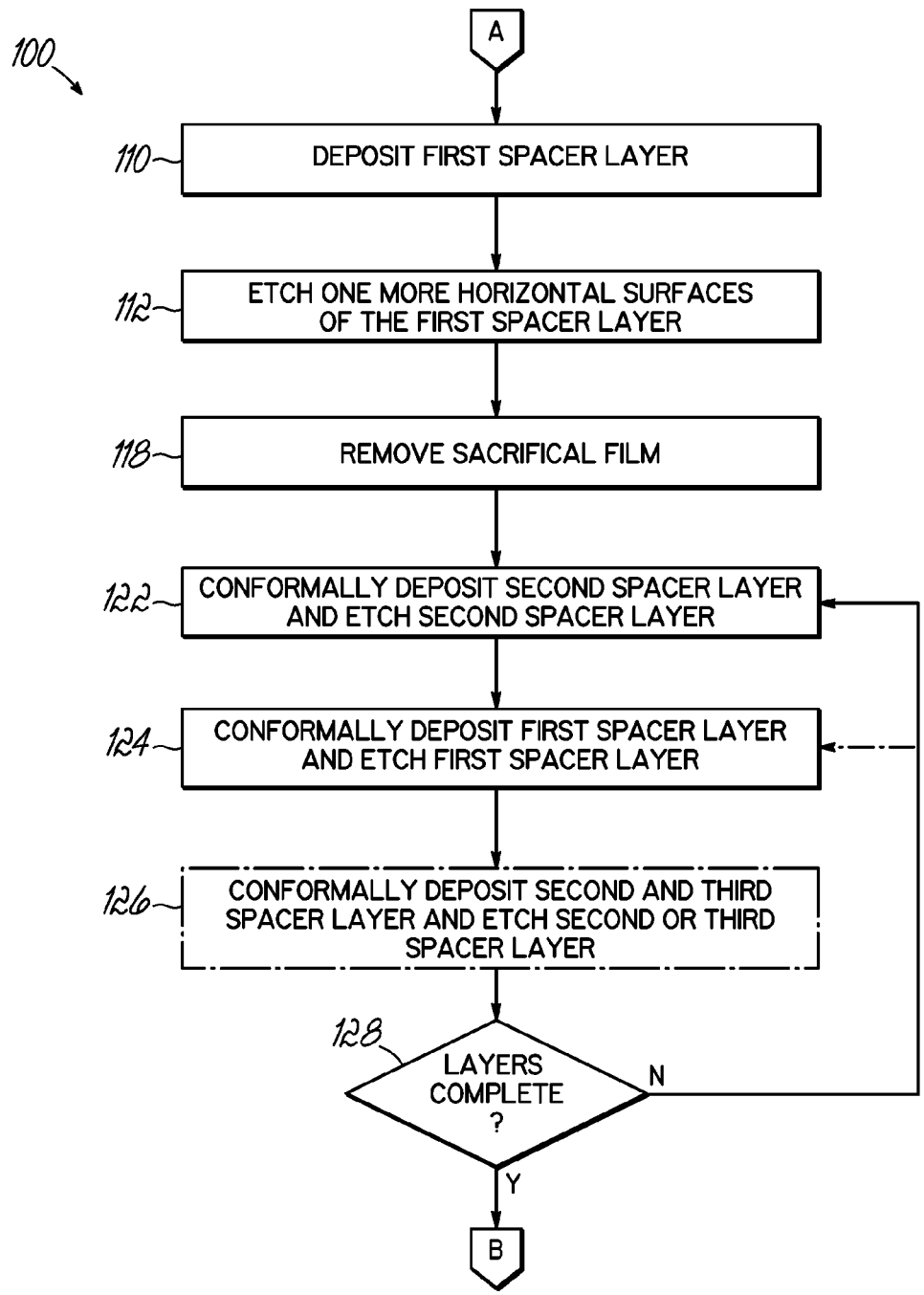
FIG. 5 is a flow chart illustrating a method of patterning a thin film on a substrate in accordance with another embodiment of the present invention.

It is certified that error appears in the above-identified patent and that said Letters Patent is hereby corrected as shown below:

In the Drawings:

In FIG. 5, Box 112, "ETCH ONE MORE HORIZONTAL SURFACES OF THE FIRST SPACER LAYER" should read --ETCH ONE OR MORE HORIZONTAL SURFACES OF THE FIRST SPACER LAYER--.

In FIG. 5, Box 118, "REMOVE SACRIFCAL FILM" should read --REMOVE SACRIFICIAL FILM--.

In the Specification:

In Col. 2, line 27, "a substrate includes" should read --a substrate and includes--.

In Col. 10, line 5, "as described above may, for example," should read --as described above and may, for example,--.

In the Claims:

In Col. 13, line 47, Claim 12, "h) using" should read --i) using--.

In Col. 13, line 51, Claim 13, "h) selectively" should read --i) selectively--.

In Col. 14, line 1, Claim 13, "i) removing" should read --j) removing--.

Signed and Sealed this
Twenty-third Day of December, 2014

Michelle K. Lee
*Deputy Director of the United States Patent and Trademark Office*